United States Patent
Lim et al.

(10) Patent No.: US 12,431,341 B2
(45) Date of Patent: Sep. 30, 2025

(54) APPARATUS FOR ARCING DIAGNOSIS, PLASMA PROCESS EQUIPMENT INCLUDING THE SAME, AND ARCING DIAGNOSIS METHOD

(71) Applicant: SAMSUNG ELECTRONICS CO., LTD., Suwon-si (KR)

(72) Inventors: Changsoon Lim, Hwaseong-si (KR); Youngdo Kim, Hwaseong-si (KR); Daewon Kang, Seoul (KR); Chansoo Kang, Hwaseong-si (KR); Kyunghyun Kim, Suwon-si (KR); Sangki Nam, Seongnam-si (KR); Kyunjin Lee, Suwon-si (KR); Sungho Jang, Suwon-si (KR); Jonghun Pi, Gunwi-gun (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 537 days.

(21) Appl. No.: 17/850,257

(22) Filed: Jun. 27, 2022

(65) Prior Publication Data
US 2023/0109672 A1 Apr. 13, 2023

(30) Foreign Application Priority Data
Oct. 7, 2021 (KR) .......................... 10-2021-0132914

(51) Int. Cl.
*H01J 37/32* (2006.01)

(52) U.S. Cl.
CPC .... *H01J 37/3299* (2013.01); *H01J 37/32522* (2013.01); *H01J 37/32568* (2013.01); *H01J 2237/0266* (2013.01); *H01J 2237/24507* (2013.01); *H01J 2237/24564* (2013.01); *H01J 2237/334* (2013.01)

(58) Field of Classification Search
None
See application file for complete search history.

(56) References Cited

U.S. PATENT DOCUMENTS 8,587,321 B2 11/2013 Chen et al.
9,170,295 B2 10/2015 Choi
(Continued)

FOREIGN PATENT DOCUMENTS

KR 10-2008-0006750 A 1/2008
KR 10-2020-0049087 A 5/2020
KR 10-2274530 B1 7/2021

*Primary Examiner* — Wilson Lee
(74) *Attorney, Agent, or Firm* — Sughrue Mion, PLLC

(57) ABSTRACT

An apparatus includes first and second VI sensors, an optical sensor, and an arcing detector. The first VI sensor is disposed in a power filter or on a power supply line connected to a heater disposed in a lower electrode of a process chamber in which a plasma process is performed. The first VI sensor senses a harmonic generated from a first power supply supplying power to the lower electrode and outputs a first signal. The optical sensor senses an intensity of light generated from the process chamber and outputs a second signal. The second VI sensor is disposed on a power supply line connected to an upper electrode and senses a harmonic generated from a second power supply supplying power to the upper electrode and outputs a third signal. The arcing detector determines whether arcing occurs based on one or more of the first, second, and third signals.

20 Claims, 13 Drawing Sheets

(56) References Cited

U.S. PATENT DOCUMENTS

| | | | |
|---|---|---|---|
| 11,935,726 B2* | 3/2024 | Radomski | H01J 37/32146 |
| 2005/0212450 A1* | 9/2005 | Martinez | H01J 37/32935 |
| | | | 315/169.4 |
| 2006/0049831 A1 | 3/2006 | Anwar et al. | |
| 2012/0259562 A1 | 10/2012 | Booth et al. | |
| 2016/0095196 A1* | 3/2016 | Chen | H05H 1/46 |
| | | | 315/111.21 |
| 2018/0053633 A1* | 2/2018 | Glazek | H01J 37/3299 |
| 2021/0104387 A1* | 4/2021 | McNally | H01J 37/32963 |
| 2021/0225614 A1* | 7/2021 | De Chambirier | H01J 37/32926 |
| 2022/0216838 A1* | 7/2022 | Gruner | H01J 37/32165 |

* cited by examiner

| | RESULT OF ARCING DIAGNOSIS (O : DETECTED, X : NOT DETECTED) | | | |
|---|---|---|---|---|
| | RF VI SENSOR | OPTICAL SENSOR | HEATER VI SENSOR | ARCING DETECTOR (Sout) |
| CASE 1 | X | X | X | X (NO ARCING OCCURS) |
| CASE 2 | X | X | O | O (ARCING OCCURS) |
| CASE 3 | X | O | O | O (ARCING OCCURS) |
| CASE 4 | O | O | O | O (ARCING OCCURS) |

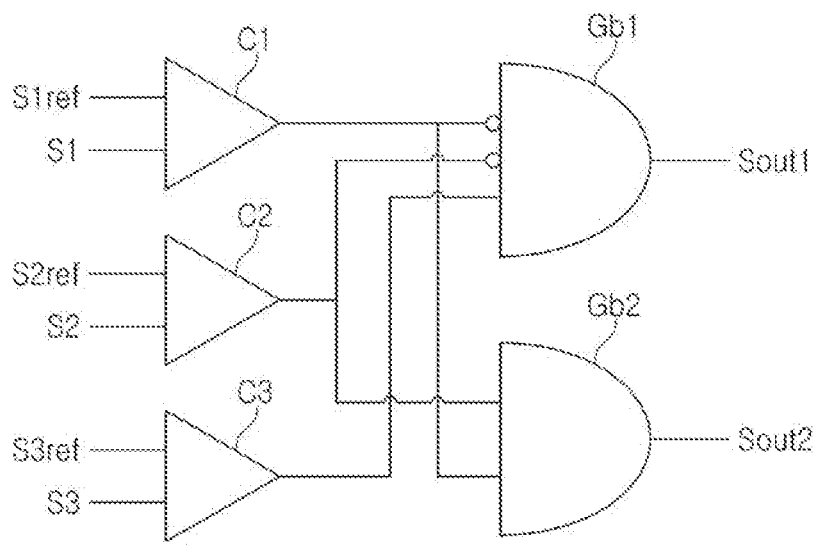

FIG. 14A

| | RESULT OF ARCING DIAGNOSIS (O : DETECTED, X : NOT DETECTED) | | | |
|---|---|---|---|---|
| | RF VI SENSOR | OPTICAL SENSOR | HEATER VI SENSOR | ARCING DETECTOR (Sout1) |
| CASE 1 | X | X | X | X (NO ARCING OCCURS) |
| CASE 2 | X | X | O | O (FIRST ARCING OCCURS) |
| CASE 3 | X | O | O | X (SECOND ARCING OCCURS) |
| CASE 4 | O | O | O | X (THIRD ARCING OCCURS) |

FIG. 14B

| | RESULT OF ARCING DIAGNOSIS (O : DETECTED, X : NOT DETECTED) | | | |
|---|---|---|---|---|
| | RF VI SENSOR | OPTICAL SENSOR | HEATER VI SENSOR | ARCING DETECTOR (Sout2) |
| CASE 1 | X | X | X | X (NO ARCING OCCURS) |
| CASE 2 | X | X | O | X (FIRST ARCING OCCURS) |
| CASE 3 | X | O | O | O (SECOND ARCING OCCURS) |
| CASE 4 | O | O | O | O (THIRD ARCING OCCURS) |

FIG. 14C

APPARATUS FOR ARCING DIAGNOSIS, PLASMA PROCESS EQUIPMENT INCLUDING THE SAME, AND ARCING DIAGNOSIS METHOD

CROSS TO REFERENCE TO RELATED APPLICATIONS

This application claims priority to Korean Patent Application No. 10-2021-0132914 filed on Oct. 7, 2021 in the Korean Intellectual Property Office, the disclosure of which is incorporated by reference herein in its entirety.

BACKGROUND

Example embodiments of the present disclosure relate to an apparatus for arcing diagnosis, plasma process equipment including the same, and an arcing diagnosis method.

An etching process may comprise removing a thin film from a region other than the region in which a photoresist is formed using a photolithography process. Recently, among semiconductor processes, plasma has been used in a process of etching a substrate. Plasma etching may include applying high energy to gaseous molecules in a vacuum state to ionize or decompose molecules to activate, and may include colliding the activated particles with a thin film to break a crystal structure of the thin film, thereby removing the thin film. Plasma etching may be performed by radio frequency (RF) power, and RF power may cause arcing in a process chamber in which plasma etching is performed. As for a general arcing diagnosis method using sensors, it may be difficult to detect micro-arcing having a low level.

SUMMARY

It is an aspect to provide an apparatus for arcing diagnosis and an arcing diagnosis method which may, by applying a voltage-current (VI) sensor disposed in a power filter connected to a heater or on a power supply line between the heater and a power supply, accurately detect micro-arcing having a low level and may also monitor abnormal behavior of plasma processing equipment.

According to an aspect of an example embodiment, an apparatus may include a first VI sensor disposed in a power filter connected to a heater or on a power supply line connected to the heater, the heater being disposed in a lower electrode of a process chamber in which a plasma process is performed and the first VI sensor configured to sense a harmonic generated from a first power supply that supplies alternating current power to the heater and to output a first signal; an optical sensor disposed on one side of the process chamber and configured to sense an intensity of light generated from the process chamber and to output a second signal; a second VI sensor disposed on a power supply line connected to an upper electrode of the process chamber, and configured to sense a harmonic generated from a second power supply supplying alternating current power to the upper electrode and to output a third signal; and an arcing detector configured to determine whether arcing occurs in the process chamber based on at least one of the first signal, the second signal, or the third signal.

According to another aspect of an example embodiment, a plasma process equipment may include a process chamber including an upper electrode and a lower electrode and being configured to perform a plasma process; a heater disposed in the lower electrode and configured to heat a substrate; a power supply device including a first power supply configured to apply a first voltage to the heater, and a second power supply configured to supply a second voltage to the upper electrode; an arcing diagnosis apparatus including a first VI sensor that is disposed in a power filter connected between the heater and the first power supply or that is disposed on a first power supply line between the heater and the first power supply, the first VI sensor being configured to detect a harmonic generated from the first power supply and to output a first signal, and an arcing detector configured to receive the first signal and to determine whether arcing occurs in the process chamber based on the first signal; and a controller configured to control the plasma process based on a result of diagnosis of the arcing detector.

According to yet another aspect of an example embodiment, an arcing diagnosis method may include performing a plasma process in a process chamber including an upper electrode and a lower electrode; outputting a first signal corresponding to a harmonic generated from a first power supply that supplies alternating current power to a heater disposed in the lower electrode, a second signal corresponding to an intensity of light generated in the process chamber, and a third signal corresponding to a harmonic generated from a second power supply that supplies alternating current power to the upper electrode; and determining whether arcing occurs in the process chamber based on at least one of the first signal, the second signal, or the third signal, wherein the first signal is output by a first VI sensor that is disposed in the heater or that is disposed on a power supply line between the lower electrode and the first power supply.

BRIEF DESCRIPTION OF DRAWINGS

The above and other aspects will be more clearly understood from the following detailed description, taken in conjunction with the accompanying drawings, in which:

FIGS. 14A, 14B, and 14C are diagrams illustrating operations of an arcing detector included in an apparatus for arcing diagnosis according to an example embodiment.

DETAILED DESCRIPTION

Hereinafter, various embodiments will be described as follows with reference to the accompanying drawings.

Figure 1:
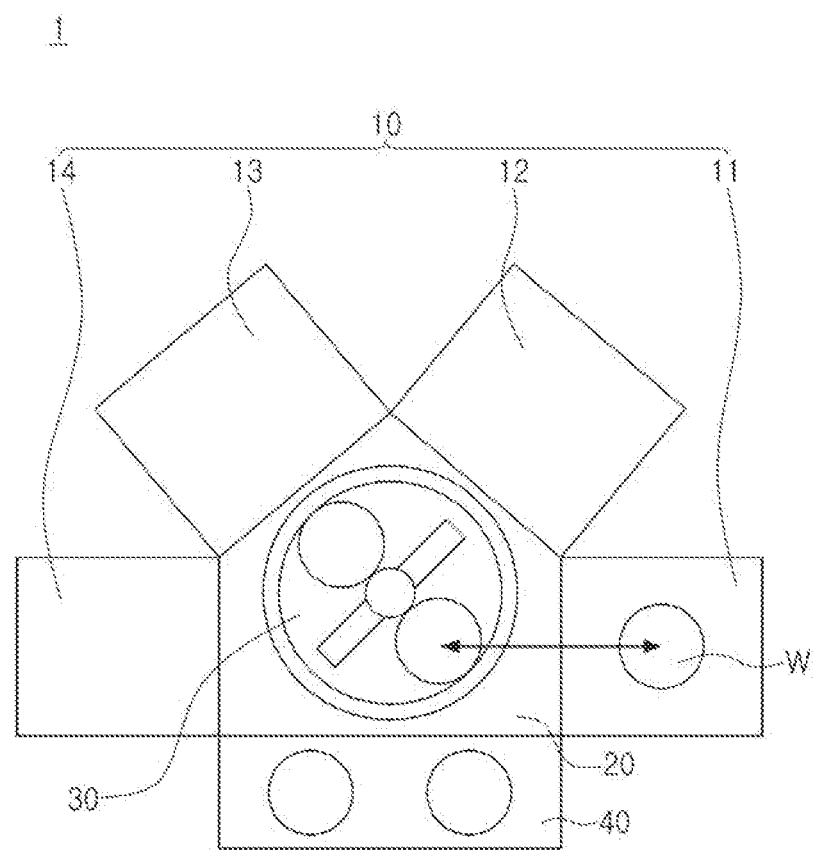
FIG. 1 is a diagram illustrating a semiconductor processing apparatus including plasma processing equipment according to an example embodiment.

FIG. 1 is a diagram illustrating a semiconductor processing apparatus including plasma processing equipment according to an example embodiment.

Referring to FIG. 1, semiconductor processing equipment 1 including plasma processing equipment in an example embodiment may include a plurality of process chambers 11-14 configured to perform a semiconductor process with respect to a substrate W. For example, the plurality of process chambers 11-14 may include a deposition process chamber performing a deposition process, a polishing process chamber performing a chemical mechanical polishing (CMP) process, and an etching process chamber generating a plasma containing radicals and ions of a source gas or removing at least a portion of device layers included in the substrate W using an etchant. The plurality of process chambers 11-14 may include an inspection process chamber inspecting the substrate W while the process is performed or after the process is completed.

For example, the substrate W may be implemented as a semiconductor substrate on which a semiconductor process is performed, and may be implemented as a wafer formed of a semiconductor material such as silicon. Semiconductor devices, wiring patterns connected to the semiconductor devices, and insulating layers covering the semiconductor devices and the wiring patterns may be formed on the substrate W by semiconductor processes performed in the plurality of process chambers 11-14, and a plurality of semiconductor chips may be manufactured from the substrate W.

For example, the plurality of process chambers 11-14 may receive the substrate W via a transfer chamber 20 and a load-lock chamber 40 and may perform a semiconductor process. The transfer chamber 20 and the load-lock chamber 40 may include a transfer robot 30, and the transfer robot 30 of the transfer chamber 20 and the load-lock chamber 40 may transport the substrate W which may be a processing object. For example, the transfer robot 30 of the transfer chamber 20 may remove a processing object such as the substrate W from the load-lock chamber 40 and may transfer the processing object to the plurality of process chambers 11-14, or may transfer the processing object among the plurality of process chambers 11-14. In an example embodiment, the transfer robot may be implemented as a handler.

The transfer robot 30 may include a chuck for fixing the processing object and a linear stage for transferring the processing object. For example, the chuck may be implemented as an electrostatic chuck (ESC) which may fix a processing object using electrostatic force. A plurality of protrusions may be formed on the electrostatic chuck and may be in contact with the processing object. In the plasma processing equipment in an example embodiment, the electrostatic chuck may operate as a lower electrode. However, example embodiments are not limited thereto.

Referring to FIG. 1, in the semiconductor processing equipment 1 including the plasma processing equipment in an example embodiment, the transfer robot 30 of the transfer chamber 20 may remove the substrate W from the load-lock chamber 40 and may transfer the substrate W to the transfer chamber 20, and may transfer the substrate W, i.e., the processing object, to the process chamber 11. However, the processing object is not limited to a wafer and, in other example embodiments, the processing object may be other objects than a wafer. For example, the substrate W may be implemented as various substrates other than a wafer, such as, for example, a mother substrate for a display.

At least one process chamber 11 of the process chambers 11-14 may be allocated as a chamber for performing an etching process. In an example embodiment, the process chamber 11 may be implemented as a plasma process chamber for removing a portion of a thin film formed on an upper surface of the substrate W using plasma. For example, in example embodiments, equipment for plasma etching including a plasma process chamber may be defined as plasma process equipment.

Figure 2:
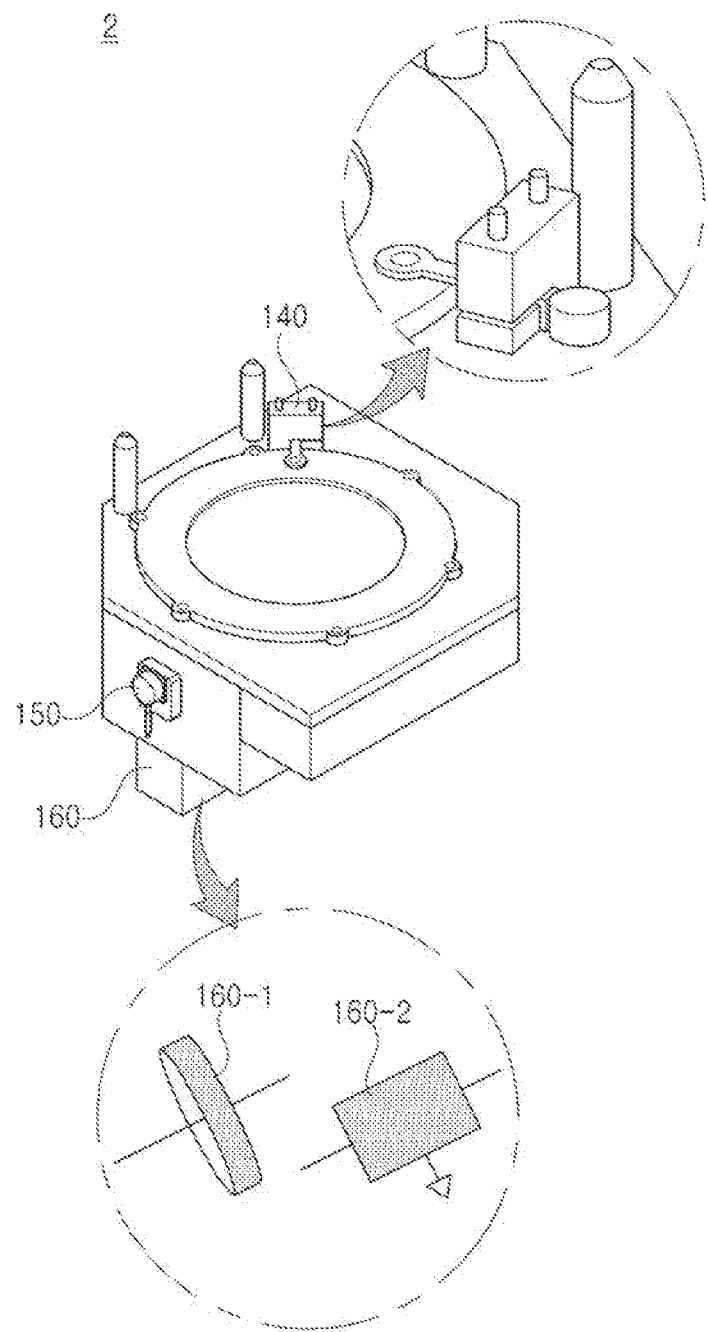
FIG. 2 is a diagram illustrating plasma process equipment according to an example embodiment.

FIG. 2 is a diagram illustrating plasma process equipment according to an example embodiment.

Referring to FIG. 2, plasma process equipment 2 in an example embodiment may include a plurality of process chambers configured to perform a plasma etching process. Only a single process chamber is illustrated in FIG. 2, but example embodiments are not limited thereto. For example, the plurality of process chambers performing the plasma etching process may be implemented by two process chambers disposed in symmetrical form, or two or more process chambers may be arranged in various manners.

The plasma etching process may be performed using radio frequency (RF) power. For example, in processes prior to the plasma etching process, incidental electric charges may be charged in the substrate, and as high-frequency power is applied during the plasma etching process, electric charges may cause arcing in the substrate. For example, arcing may refer to damage occurring around a substrate and/or in a metal portion due to an abnormal environment under high-frequency power. However, the cause of arcing is not limited thereto.

Generally, arcing may occur between a reactor and a substrate, or between two positions within a substrate. Arcing may cause unintended sputtering of a material, unintended deposition of a material, degradation of a material of a substrate including high temperature volatilization of a portion of the material, and/or damage to plasma processing equipment.

Arcing may cause significant damage to the substrate and/or equipment even when arcing occurs within a small range for a short period of time. In an example, arcing may create microscopic craters which may damage a gate structure, a dielectric layer, and/or a metal line, or the like, formed on the substrate. Accordingly, when arcing occurs during a plasma etching process, it may be necessary to accurately diagnose arcing in real time to prevent damage to the substrate or to replace a damaged substrate.

The plasma process equipment 2 in an example embodiment may include a first voltage-current (VI) sensor 160 disposed in a direction of the lower electrode of the process chamber in which the plasma process is performed, an optical sensor 150 disposed on one side of the process chamber, and a second VI sensor 140 disposed in the direction of the upper electrode of the process chamber.

In an example, the optical sensor 150 may include a viewport penetrating one side of the process chamber and collecting light generated from plasma, and a lens for condensing light collected by the viewport and amplifying intensity of light. The optical sensor 150 may detect an intensity of light by allowing light emitted while the plasma etching process is performed in the process chamber to be incident through a lens.

In the plasma process equipment 2 in an example embodiment, when arcing occurs during the plasma etching process, the optical sensor 150 may detect light having a strong intensity for a short period of time. However, since the optical sensor 150 is disposed on one side of the process chamber, the detected light intensity may be varied depending on a field of view even when the same level of arcing occurs. For example, the optical sensor 150 may detect light having a stronger intensity when the arcing portion is included within the field of view of the optical sensor 150 than when the arcing portion is not included within the field of view of the optical sensor 150.

When a high level of arcing occurs, the optical sensor 150 may detect an abnormality in the process chamber even when the arcing portion is not included in the field of view of the optical sensor 150. However, the optical sensor 150 may not detect an abnormality in the process chamber when a low level of micro-arcing occurs and the arcing portion is not included in the field of view of the optical sensor 150.

In the plasma processing equipment 2 in an example embodiment, the second VI sensor 140 may detect arcing using electromagnetic coupling of high-frequency power applied through a high-frequency rod. For example, high frequency power applied via the high frequency rod may be power applied to the upper electrode of the process chamber.

The second VI sensor 140 in an example embodiment may be disposed on a power supply line connecting the upper electrode to a power supply for supplying AC power to the upper electrode. The second VI sensor 140 may monitor high-frequency power, and accordingly, the second VI sensor 140 may not detect arcing of a low level such as micro-arcing.

In other words, micro-arcing occurring during the plasma etching process may not be accurately diagnosed by only a combination of the optical sensor 150 and the second VI sensor 140.

Arcing occurring during the plasma etching process may include soft arcing which may be instantaneously generated and disappear, and hard arcing which may continuously grow. For example, even when the arcing having a low level generated during the plasma etching process is hard arcing or soft arcing, the arcing may cause serious damage to the substrate and/or process equipment. Therefore, it may be necessary to accurately diagnose whether micro-arcing occurs.

The first VI sensor 160 included in the plasma process equipment 2 in an example embodiment may diagnose whether arcing occurs by detecting a harmonic generated from a power supply that supplies AC power to the lower electrode of the process chamber.

As an example, the first VI sensor 160 may be configured as a non-contact VI sensor 160-1 or a contact VI sensor 160-2. Similarly to the second VI sensor 140, the non-contact VI sensor 160-1 may detect arcing using electromagnetic coupling of high frequency power. The contact type VI sensor 160-2 may be implemented by an arcing detector circuit including a plurality of circuit devices.

The first VI sensor 160 in an example embodiment may accurately detect micro-arcing having a low level as well as arcing having a high level. Accordingly, the plasma process equipment 2 in an example embodiment may accurately diagnose arcing even when the field of view of the optical sensor 150 is insufficient or arcing having a low level occurs.

However, the configuration and structure of the plasma process equipment 2 illustrated in FIG. 2 is merely an example and example embodiments are not limited thereto. As an example, the plasma processing equipment 2 may further include an arcing detector and a controller. Also, the plasma processing equipment 2 may have a structure different from the illustrated example.

Figure 3A:
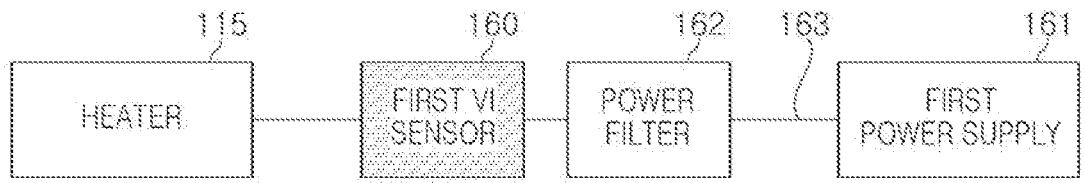
FIGS. 3A, 3B, and 3C are diagrams illustrating a connection relationship of a first VI sensor included in an apparatus for arcing diagnosis according to an example embodiment.
Figure 3B:
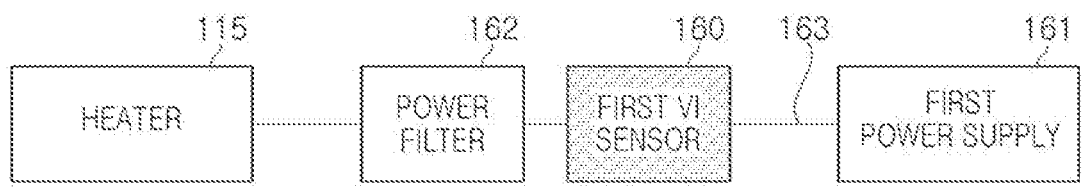
Figure 3C:
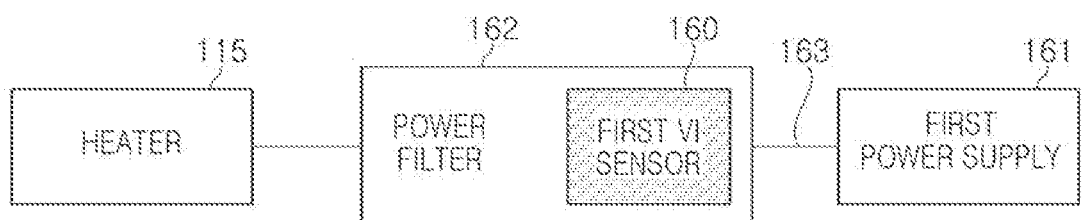

FIGS. 3A, 3B, and 3C are diagrams illustrating a connection relationship of a first VI sensor included in an apparatus for arcing diagnosis according to an example embodiment.

Referring to FIGS. 3A, 3B, and 3C, the first VI sensor 160 included in the apparatus for arcing diagnosis in an example embodiment may be disposed between a heater 115 and a first power supply 161. For example, the heater 115 may be disposed in the lower electrode of the process chamber, and the first power supply 161 may apply high-frequency power to the lower electrode.

A power filter 162 may be disposed in a path between the heater 115 and the first power supply 161. The power filter 162 may block the high-frequency power induced to the heater 115 from flowing to the first power supply 161.

In the apparatus for arcing diagnosis in an example embodiment, the power filter 162 may include an electromagnetic wave filter which may attenuate the magnitude of electromagnetic interference (EMI) that is generated from the heater 115 and transmitted to the first power source 161. For example, the electromagnetic wave filter may include an EMI inductor and an EMI capacitor.

Referring to FIG. 3A, in the apparatus for arcing diagnosis in an example embodiment, the first VI sensor 160 may be disposed on the power supply line 163 between the heater 115 and the power filter 162. Referring to FIG. 3B, in the apparatus for arcing diagnosis in another example embodiment, the first VI sensor 160 may be disposed on the power supply line 163 between the power filter 162 and the first power supply 161. In other words, in the embodiments illustrated with respect to FIGS. 3A and 3B, the first VI sensor 160 may be provided separately from the power filter 162. Referring to FIG. 3C, in the apparatus for arcing diagnosis in another example embodiment, the first VI sensor 160 may be disposed in the power filter 162.

In the apparatus for diagnosing arcing in an example embodiment, the first VI sensor 160 may output a first signal for accurately diagnosing whether arcing occurs in the process chamber regardless of a position of the first VI sensor 160.

The apparatus for arcing diagnosis in an example embodiment may include a corresponding first VI sensor 160, a corresponding optical sensor, and a corresponding second VI sensor in each process chamber. However, example embodiments are not limited thereto. For example, when the number of heaters 115 corresponding to the process chamber is two or more, the apparatus for arcing diagnosis may include a plurality of first VI sensors 160 corresponding to the process chamber. That is, the apparatus for arcing diagnosis may include a plurality of first VI sensors 160 corresponding respectively to the heaters 115.

Figure 4:
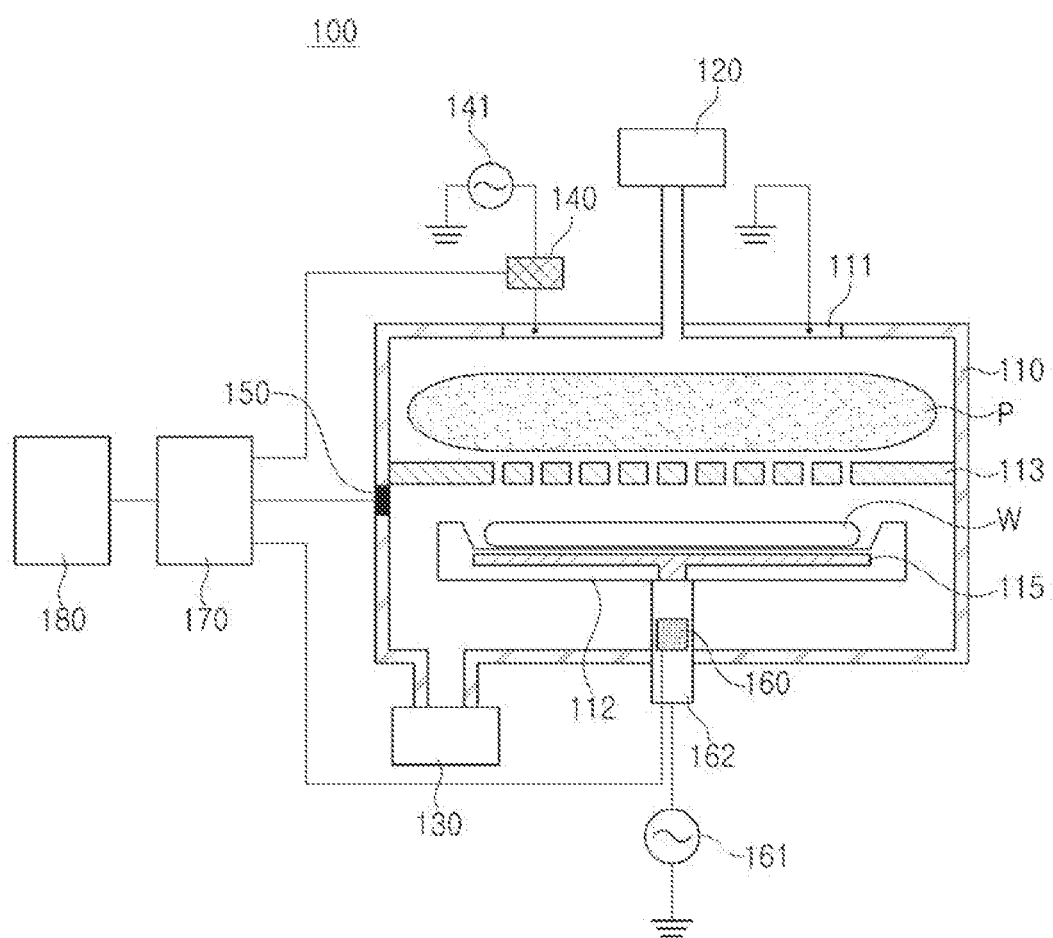
FIG. 4 is a diagram illustrating an apparatus for arcing diagnosis and plasma process equipment including the apparatus for arcing diagnosis according to an example embodiment.

FIG. 4 is a diagram illustrating an apparatus for arcing diagnosis and plasma process equipment including the apparatus for arcing diagnosis according to an example embodiment.

Referring to FIG. 4, the plasma process equipment 100 in an example embodiment may include a process chamber 110, a process gas supply 120, an exhaust apparatus 130, an apparatus for arcing diagnosis including a plurality of sensors 140, 150 and 160, an arcing detector 170, and a controller 180. However, example embodiments are not limited thereto, and in some example embodiments, the plasma process equipment 100 may further include a cooling device not illustrated.

The process chamber 110 may provide a space in which plasma P is generated from a process gas provided by the process gas supply 120. The plasma P generated in the internal space of the process chamber 110 may be used to perform an etching process on the substrate W, the processing object.

An outer wall of the process chamber 110 may be formed of a material having excellent wear resistance and corrosion resistance. The process chamber 110 may maintain an internal space in a closed state having a predetermined pressure and temperature in a plasma processing process, such as, for example, an etching process.

An exhaust apparatus 130 that removes gas from the internal space may be disposed in one region of the outer wall of the process chamber 110. The exhaust apparatus 130 may include an exhaust device for discharging gas in the process chamber 110 to perform a plasma etching process. As an example, the exhaust apparatus may be implemented as a vacuum pump.

The process chamber 110 may include an upper electrode 111, a lower electrode 112, and an induction electrode 113. For example, the internal space of the process chamber 110 may be divided by the induction electrode 113 The process gas supply 120 may supply a process gas to the internal space between the upper electrode 111 and the induction electrode 113. For example, the process gas may include $O_2$, $Cl_2$, and $SF_6$.

The structure of the upper electrode 111 illustrated in FIG. 4 is merely an example embodiment and example embodiments are not limited thereto. For example, the process gas supply 120 may have a structure connected to the upper electrode 111. In this case, the upper electrode 111 may be an electrode having a showerhead shape, and the process gas supplied from the process gas supply 120 may be sprayed into the process chamber 110 through an injection hole of the upper electrode 111. Also, the upper electrode 111 may be disposed on the side of the process chamber 110 in example embodiments.

During operation of the process chamber 110, the substrate W may be disposed between the induction electrode 113 and the lower electrode 112, that is, for example, on the upper surface of the lower electrode 112, and the process gas in a plasma P state may be sprayed to the upper surface of the substrate W, thereby performing the plasma etching process. For example, the lower electrode 112 may be configured as an electrostatic chuck (ESC) that fixes the substrate W using static electricity. The lower electrode 112 may have a circular planar shape to support the circular substrate W, but example embodiments are not limited thereto.

A heater 115 may be disposed in the lower electrode 112. The heater 115 may receive AC power from the first power supply 161 and may heat the substrate W, thereby further facilitating etching. For example, the heater 115 may include a spiral-shaped coil. Heat generated by the heater 115 may be transferred to the substrate W via a dielectric plate, thereby maintaining the substrate W at a predetermined temperature.

The plasma etching process may be performed with respect to the substrate W on which the mask layer is formed. For example, the substrate W may have a structure in which a lower substrate formed of silicon, a mold layer, and a mask layer are stacked. The mold layer may have a structure in which sacrificial layers on which a gate is formed and interlayer insulating layers are alternately stacked, and the sacrificial layers may be formed of a material etched with etch selectivity with respect to the interlayer insulating layers.

For example, the interlayer insulating layers may be formed of at least one of silicon oxide or silicon nitride, and the sacrificial layers may be formed of a material different from that of the interlayer insulating layers, such as silicon, silicon oxide, silicon carbide, or silicon nitride. The mask layer may be formed of a material layer including carbon, such as an amorphous carbon layer (ACL) or a spin-on hardmask (SOH). However, example embodiments are not limited thereto. For example, the substrate W may further include other structures in addition to the lower substrate, the mold layer, and the mask layer, and each of the components may be formed of various materials.

The plasma etching process may be performed in sequence with respect to the mask layer, the mold layer, and the lower substrate. Holes penetrating the mask layer and the mold layer and recesses for the lower substrate, extending from the holes, may be formed by the plasma etching process.

To perform a plasma etching process, the plasma process equipment 100 may include a power supply device including a plurality of power supplies. For example, the power supply device may include a first power supply 161 that applies a first voltage to the heater 115 of the process chamber 110, and a second power supply 141 that applies a second voltage to the upper electrode 111 of the process chamber 110.

For example, the first voltage applied to the heater 115 may operate the heater 115 for heating the substrate W to facilitate etching. The second voltage applied to the upper electrode 111 may be configured as a source voltage forming a high-frequency electric field between the upper electrode 111 and the induction electrode 113 and exciting the process gas supplied into the process chamber 110 to be in a plasma (P) state. The process gas excited to the plasma P state may be sprayed to the upper surface of the substrate W disposed in the process chamber 110 through a gas spraying device.

Also, although not illustrated in FIG. 4, the power supply device may further include a power supply for applying high-frequency power to the lower electrode 112 of the process chamber 110. The high frequency power applied to the lower electrode 112 may be configured as a bias voltage for performing etching by regulating ion bombardment energy of a process gas excited in the plasma P state.

As described above, a power filter 162 that attenuates the magnitude of electromagnetic interference that is generated from the heater 115 and transmitted to the first power supply 161 may be connected between the heater 115 and the first power supply 161.

The plasma process equipment 100 in an example embodiment may include an apparatus for arcing diagnosis for diagnosing arcing which may occur during a plasma etching process. For example, the apparatus for arcing diagnosis may include at least one sensor for detecting an abnormal signal and an arcing detector 170. As an example, the at least one sensor may include a first VI sensor 160, an optical sensor 150, and a second VI sensor 140.

In some example embodiments, the first VI sensor 160 may be disposed in the power filter 162 connected between the heater 115 and the first power supply 161. The first VI sensor 160 may sense a harmonic generated from the first power supply 161 and may output a first signal. As an example, the first signal may be a voltage signal and/or a current signal.

The optical sensor 150 may be disposed on one side of the process chamber 110. The optical sensor 150 may sense an intensity of light generated in the process chamber 110 and may output a second signal. For example, the second signal may be a light intensity signal.

The second VI sensor 140 may be disposed on a power supply line connected between the upper electrode 111 of the process chamber 110 and the second power supply 141. The second VI sensor 140 may sense a harmonic generated from the second power supply 141 supplying AC power to the upper electrode and may output a third signal. For example, the third signal may be a voltage signal and/or a current signal.

The arcing detector 170 may receive the first signal, the second signal, and the third signal and may determine whether arcing occurs in the process chamber 110 based on at least one of the first signal, the second signal, and the third signal. The arcing detector 170 may detect arcing information generated in the process chamber 110 and may store arcing data including the arcing information. For example, the arcing data may include arcing signal information, an arcing type, arcing position information, and the like. However, example embodiments are not limited thereto.

The arcing signal information included in the arcing data may be information of the first signal, the second signal, and/or the third signal. For example, the arcing signal information may include sizes and shapes of the first signal, the second signal, and/or the third signal.

The arcing data may include the information of whether the arcing occurring in the process chamber 110 is soft arcing or hard arcing. As an example, soft arcing may be instantaneously generated and disappear, and hard arcing may continuously grow after being generated.

The apparatus for arcing diagnosis included in the plasma process equipment 100 in an example embodiment may diagnose whether arcing occurs in the process chamber 110 by comprehensively using various methods.

The arcing detector 170 may detect whether arcing occurs in the process chamber 110 based on changes in magnitude of a least one of the first signal, the second signal, and the third signal. For example, when an abnormal signal in which the magnitude of at least one of the first signal, the second signal, and the third signal abruptly changes is sensed, the arcing detector 170 may determine the corresponding signal as an arcing signal and may determine that arcing occurs in the process chamber 110.

The arcing detector 170 may detect whether arcing occurs in the process chamber 110 based on a relationship between the first signal, the second signal, and the third signal. For example, when one of the first signal, the second signal, or the third signal is detected to be out of synchronization with the other signals among the first signal, the second signal, and the third signal, the arcing detector 170 may determine the corresponding signal as an arcing signal and may diagnose that arcing occurs in the process chamber 110.

The arcing detector 170 may detect whether arcing occurs in the process chamber 110 using signal information included in the accumulated and stored arcing data as a reference signal. For example, the arcing detector 170 may compare a detection signal including the first signal, the second signal, and/or the third signal with a pre-stored reference signal. Accordingly, when a significant difference is present between the reference signal and the detection signal, the corresponding signal may be determined as an arcing signal and arcing may be determined to occur in the process chamber 110.

The controller 180 may control the plasma etching process based on the result of diagnosis of the arcing detector 170. The controller 180 may include a process module controller (PMC) that controls an environment of a process of the process chamber 110 and a cluster tool controller (CTC) that controls the plasma process equipment 100 as a whole. For example, the process module controller may control the temperature and pressure, a process gas, plasma, or the like, in the process chamber 110. The cluster tool controller may control the transfer of the substrate W.

In the plasma process equipment 100 in an example embodiment, when the arcing detected by the arcing detector 170 is soft arcing, the process module controller may control the environment of the process of the process chamber 110 such that the arcing disappears. When the arcing detected by the arcing detector 170 is hard arcing, the cluster tool controller may hold the substrate W and may cease the plasma process. Also, when serious damage has occurred to the substrate W, the cluster tool controller may control the substrate W to be replaced and the plasma etching process to be performed again.

However, the structure and configuration of the plasma process equipment 100 illustrated in FIG. 4 is merely an example and example embodiments are not limited thereto. As an example, in some example embodiments, the power supply device of the plasma processing equipment 100 may further include a matching circuit or an impedance matching device for matching an output voltage of the power.

Figure 5:
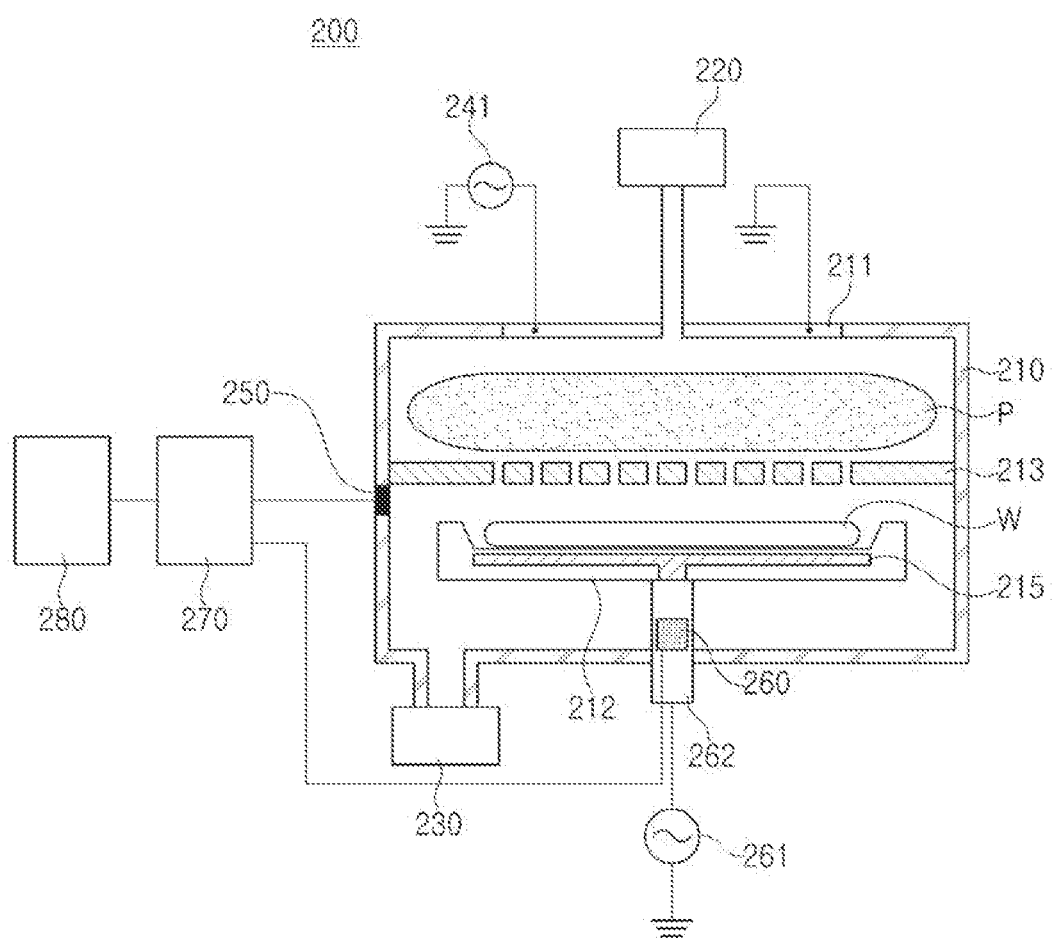
FIG. 5 is a diagram illustrating an apparatus for arcing diagnosis and plasma process equipment including the apparatus for arcing diagnosis according to an example embodiment.

FIG. 5 is a diagram illustrating an apparatus for arcing diagnosis and plasma process equipment including the apparatus for arcing diagnosis according to an example embodiment.

Referring to FIG. 5, plasma process equipment 200 in an example embodiment may correspond to the plasma process equipment 100 illustrated in FIG. 4. For example, the plasma process equipment 200 may include a process chamber 210, a process gas supply 220, an exhaust apparatus 230, an apparatus for arcing diagnosis including a plurality of sensors 250 and 260, an arcing detector 270, and a controller 280.

The process chamber 210 may provide a space in which plasma P used to perform an etching process on the substrate W is formed from a process gas provided by the process gas supply 220. The exhaust apparatus 230 may remove the gas from the process chamber 210 to perform a plasma etching process.

The process chamber 210 may include an upper electrode 211 to which high-frequency power is applied from the second power supply 241, a lower electrode 212, and an induction electrode 213. A heater 215 to which an AC voltage is applied from the first power supply 261 may be disposed in the lower electrode 212.

The plasma process equipment 200 in an example embodiment may include a power filter 262 disposed between the heater 215 and the first power supply 261. In some example embodiments, the apparatus for arcing diagnosis included in the plasma process equipment 200 may include a first VI sensor 260 disposed in the power filter 262, and an optical sensor 250 disposed on one side of the process chamber 210.

However, the apparatus for arcing diagnosis included in the plasma process equipment 200 may omit a component corresponding to the second VI sensor 140 of the plasma process equipment 100 illustrated in FIG. 4. Accordingly, the arcing detector 270 may determine whether arcing occurs based on the first signal output by the first VI sensor 260 and the second signal output by the optical sensor 250.

Figure 6:
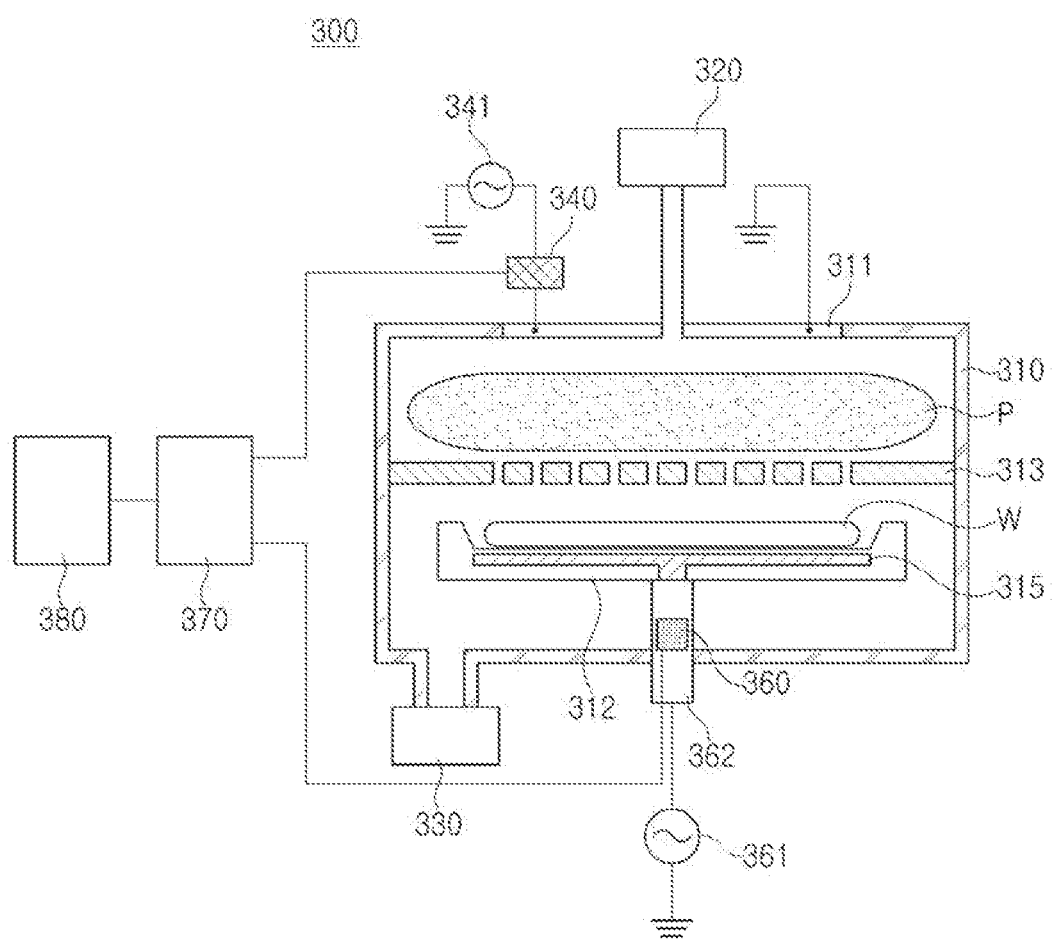
FIG. 6 is a diagram illustrating an apparatus for arcing diagnosis and plasma process equipment including the apparatus for arcing diagnosis according to an example embodiment.

FIG. 6 is a diagram illustrating an apparatus for arcing diagnosis and plasma process equipment including the apparatus for arcing diagnosis according to an example embodiment.

Referring to FIG. 6, plasma process equipment 300 in an example embodiment may correspond to the plasma process equipment 100 illustrated in FIG. 4. For example, the plasma process equipment 300 may include a process chamber 310, a process gas supply 320, an exhaust apparatus 330, an apparatus for arcing diagnosis including a plurality of sensors 340 and 360, an arcing detector 370, and a controller 380.

The process chamber 310 may provide a space in which plasma P used to perform an etching process on the substrate W is formed from a process gas provided by the process gas supply 320. The exhaust apparatus 330 may remove the gas from the process chamber 310 to perform a plasma etching process.

The process chamber 310 may include an upper electrode 311 to which high-frequency power is applied from the second power supply 341, a lower electrode 312, and an induction electrode 313. A heater 315 to which an AC voltage is applied from the first power supply 361 may be disposed in the lower electrode 312.

The plasma process equipment 300 in an example embodiment may include a power filter 362 disposed between the heater 315 and the first power supply 361. In some example embodiments, the apparatus for arcing diagnosis included in the plasma process equipment 300 may include a first VI sensor 360 disposed in the power filter 362 and a second VI sensor 340 disposed on the power supply line between the and the upper electrode 311 and the second power supply 341.

However, the apparatus for arcing diagnosis included in the plasma process equipment 300 may omit a component corresponding to the optical sensor 150 of the plasma process equipment 100 illustrated in FIG. 4. Accordingly, the arcing detector 370 may determine whether arcing occurs based on the first signal output by the first VI sensor 360 and the third signal output by the second VI sensor 340.

Figure 7:
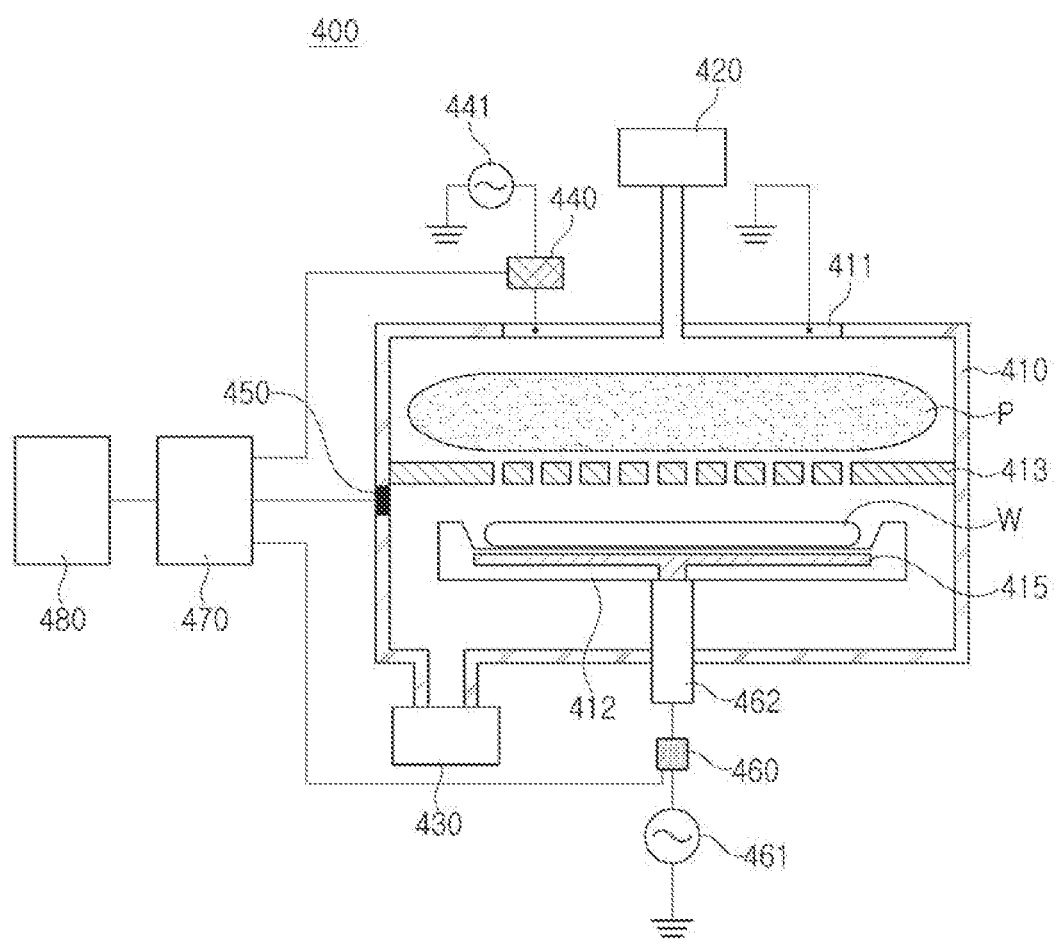
FIG. 7 is a diagram illustrating an apparatus for arcing diagnosis and plasma process equipment including the apparatus for arcing diagnosis according to an example embodiment.

FIG. 7 is a diagram illustrating an apparatus for arcing diagnosis and plasma process equipment including the apparatus for arcing diagnosis according to an example embodiment.

Referring to FIG. 7, plasma process equipment 400 in an example embodiment may correspond to the plasma process equipment 100 illustrated in FIG. 4. For example, the plasma process equipment 400 may include a process chamber 410, a process gas supply 420, an exhaust apparatus 430, an apparatus for arcing diagnosis including a plurality of sensors 440, 450, and 460, an arcing detector 470, and a controller 480.

The process chamber 410 may provide a space in which plasma P used to perform an etching process on the substrate W is formed from a process gas provided by the process gas supply 420. The exhaust apparatus 430 may remove the gas from the process chamber 410 to perform a plasma etching process.

The process chamber 410 may include an upper electrode 411 to which high-frequency power is applied from the second power supply 441, a lower electrode 412, and an induction electrode 413. A heater 415 to which an AC voltage is applied from the first power supply 461 may be disposed in the lower electrode 412.

The plasma process equipment 400 in an example embodiment may include a power filter 462 disposed between the heater 415 and the first power supply 461. In some example embodiments, the apparatus for arcing diagnosis included in the plasma process equipment 400 may include a first VI sensor 460, an optical sensor 450 disposed on one side of the process chamber 410, and a second VI sensor 440 disposed on the second power supply line between an upper electrode 411 and a second power supply 441.

However, in the apparatus for arcing diagnosis included in the plasma process equipment 400, the first VI sensor 460 may be disposed on the first power supply line between the power filter 462 and the first power supply 461 rather than in the power filter. Referring to FIGS. 3A to 3C together, the first VI sensors 160, 260, and 360 of each of the plasma process equipment 100, 200, and 300 illustrated in FIGS. 4 to 6 may correspond to the connection relationship of the VI sensor 160. The first VI sensor 460 of the plasma processing equipment 400 illustrated in FIG. 7 may correspond to the connection relationship of the first VI sensor 160 illustrated in FIG. 3B.

Figure 8:
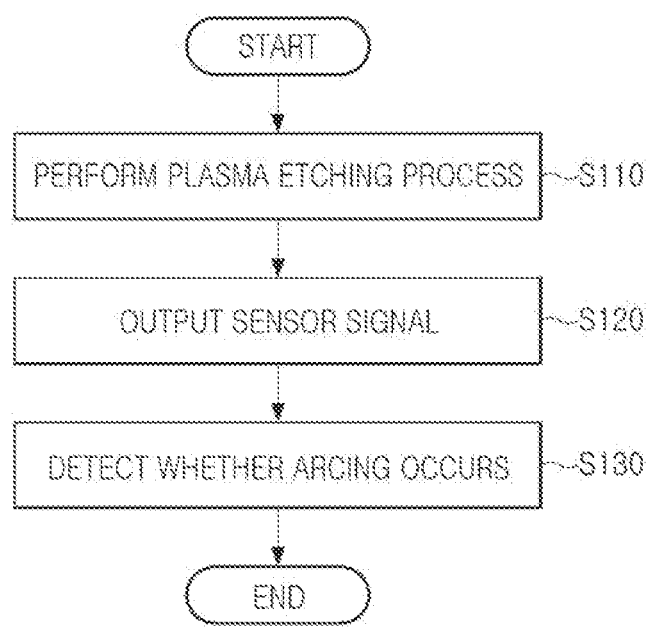
FIG. 8 is a flowchart illustrating an arcing diagnosis method of plasma process equipment according to an example embodiment.

FIG. 8 is a flowchart illustrating an arcing diagnosis method of plasma process equipment according to an example embodiment.

Referring to FIG. 8, the plasma process equipment in an example embodiment may perform a plasma etching process (S110). The plasma etching process may be performed as described in the aforementioned example embodiment with reference to FIG. 4. For example, the plasma process equipment may be performed in a process chamber including an upper electrode and a lower electrode, where a substrate on which a plasma etching process is performed is disposed on the lower electrode.

During the plasma etching process, at least one sensor included in the plasma process equipment may output a sensor signal for diagnosing whether arcing occurs in the process chamber (S120). As an example, the sensor signal may include a first signal, a second signal, and/or a third signal.

The first signal may correspond to a harmonic generated from a first power supply supplying AC power to a heater disposed in the lower electrode of the process chamber. In the arcing diagnosis method in an example embodiment, the first signal may be output by the first VI sensor disposed in the heater or disposed on the power supply line between the lower electrode and the first power supply.

The second signal may correspond to an intensity of light generated in the process chamber. For example, the second signal may be output by an optical sensor disposed on one side of the process chamber.

The third signal may correspond to a harmonic generated from a second power supply supplying AC power to the upper electrode of the process chamber. For example, the third signal may be output by the second VI sensor disposed on a power supply line connected to the upper electrode of the process chamber.

The arcing detector of the apparatus for arcing diagnosis included in the plasma process equipment in an example embodiment may detect whether arcing occurs in the process chamber based on at least one of the first signal, the second signal, or the third signal (S130).

The plasma process equipment may control the environment of the process of the process chamber and/or may replace the substrate based on the result of diagnosis of whether arcing occurs. When arcing occurs, the plasma process equipment may also be damaged, such that the plasma process equipment may also be inspected when the process ceases.

Figure 9:
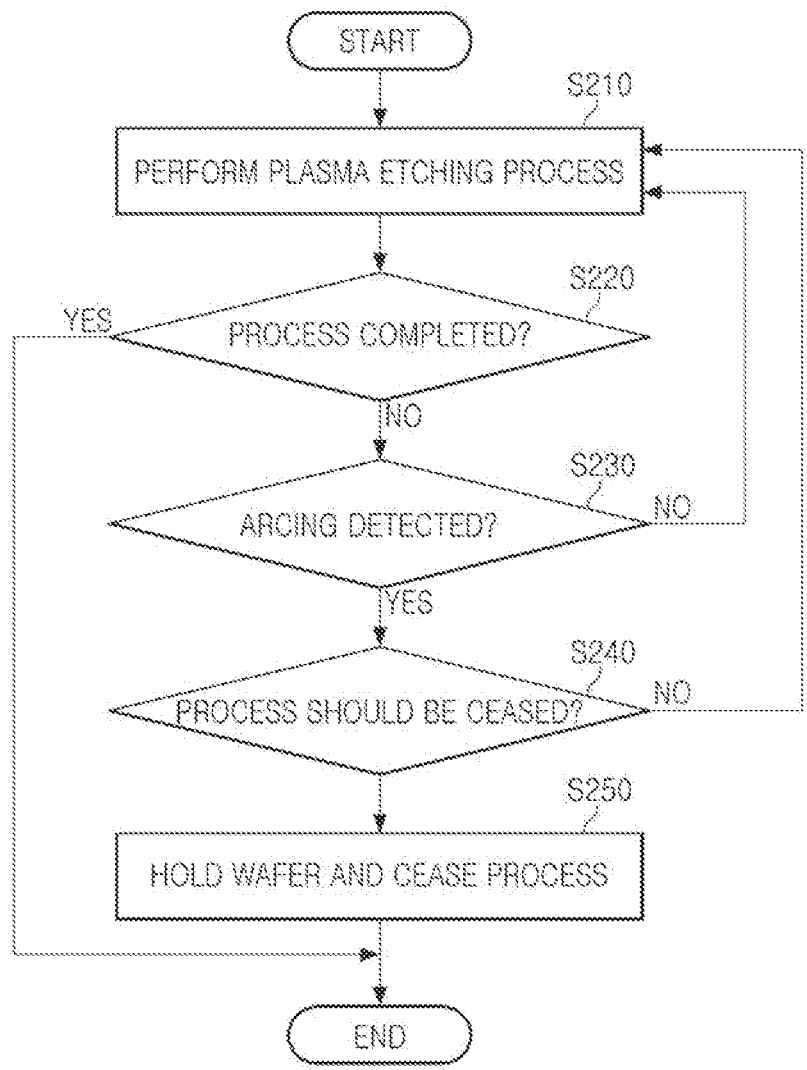
FIG. 9 is a flowchart illustrating an arcing diagnosis method of plasma process equipment according to an example embodiment.

FIG. 9 is a flowchart illustrating an arcing diagnosis method of plasma process equipment according to an example embodiment.

Referring to FIG. 9, the plasma process equipment in an example embodiment may perform a plasma etching process according to the aforementioned example embodiment described with reference to FIG. 4 (S210). For example, the plasma process equipment may be performed in a process chamber including an upper electrode and a lower electrode, where a substrate on which a plasma etching process is performed is disposed on the lower electrode.

It may be determined in operation S220 whether the process is completed. If the process is completed (operation S220, YES), the arcing diagnosis method ends. If the process is not completed (operation S220, NO), it may be determined whether an arcing signal is detected in operation S230. For example, at least one sensor included in the plasma process equipment may output a signal for determining whether arcing occurs during the plasma etching process before the process is completed. For example, the signal for determining whether arcing occurs may include a first signal output by the first VI sensor, a second signal output by the optical sensor, and a third signal output by the second VI sensor.

The plasma process equipment in an example embodiment may determine whether arcing is detected (S230). For example, the plasma process equipment may detect arcing occurring in the process chamber based on at least one of the first signal, the second signal, and the third signal output during the plasma etching process. For example, an abnormal signal for detecting that arcing occurs may be defined as an arcing signal. The arcing signal may be at least one of the first signal, the second signal, and the third signal.

When arcing is not detected (S230, NO), the plasma process equipment may continue to perform the plasma etching process. When an arcing signal is detected during the process (S230, YES), the plasma process equipment may determine whether the plasma process should be ceased (S240). When it is determined that the plasma process should not be ceased (S240, NO), the plasma process equipment may continue to perform the plasma etching process. When it is determined that the plasma process should be ceased (S240, YES), the plasma process equipment may hold the substrate and cease the plasma process (S250).

The plasma process equipment may detect information on arcing occurring in the process chamber based on the detected arcing signal. For example, the plasma processing equipment may determine the level of arcing occurring in the process chamber, and may determine whether the arcing is soft arcing or hard arcing. However, example embodiments are not limited thereto.

The plasma process equipment may hold the substrate on which the etching process has been performed and may cease the process based on the detected arcing information.

For example, when the arcing has a low level equal to or less than a threshold level, and/or is soft arcing, the plasma processing equipment may determine that there is no significant damage to the substrate, and may control the environment of process and may continue the plasma etching process. The threshold level may be predetermined.

When the arcing has a high level above a threshold level, and/or is hard arcing, the plasma processing equipment may determine that there is significant damage to the substrate and/or equipment and may replace or repair the substrate and/or equipment components. The threshold level may be predetermined and may be different from the threshold level for the low level arcing. Thereafter, the plasma process equipment may perform the plasma etching process again.

However, example embodiments are not limited thereto. For example, the plasma processing equipment may determine whether arcing occurs using the arcing data obtained from a previously performed plasma etching process and may respond thereto, and accordingly, even when microarcing and/or soft arcing occurs, the plasma processing equipment may determine that there is significant damage to the substrate, may hold the substrate and may cease the process. When arcing occurs, a method of determining whether to respond simply by controlling the environment of the process or by controlling to cease the process may be varied in example embodiments.

Figure 10:
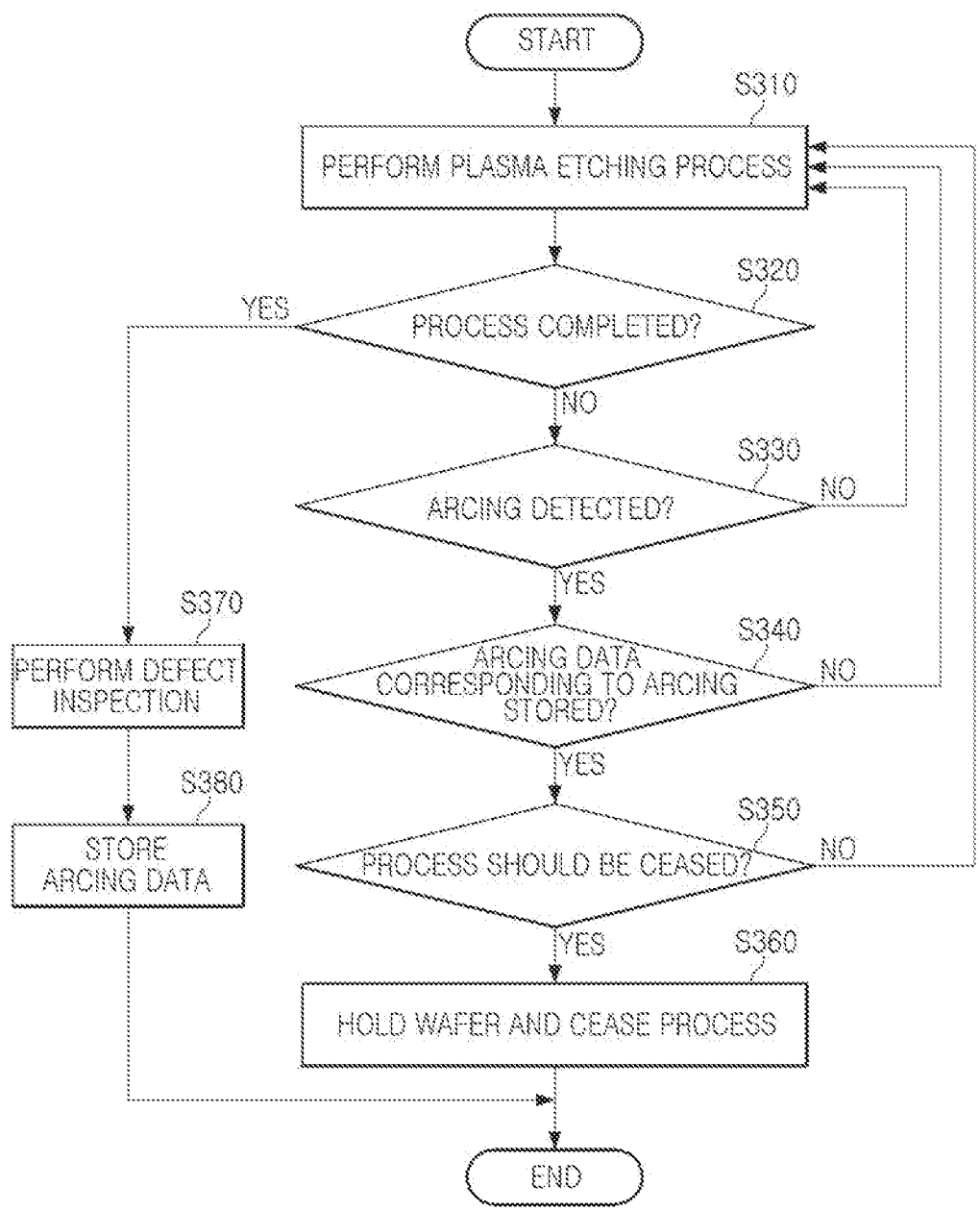
FIG. 10 is a flowchart illustrating an arcing diagnosis method of plasma process equipment according to an example embodiment.
Figure 11:
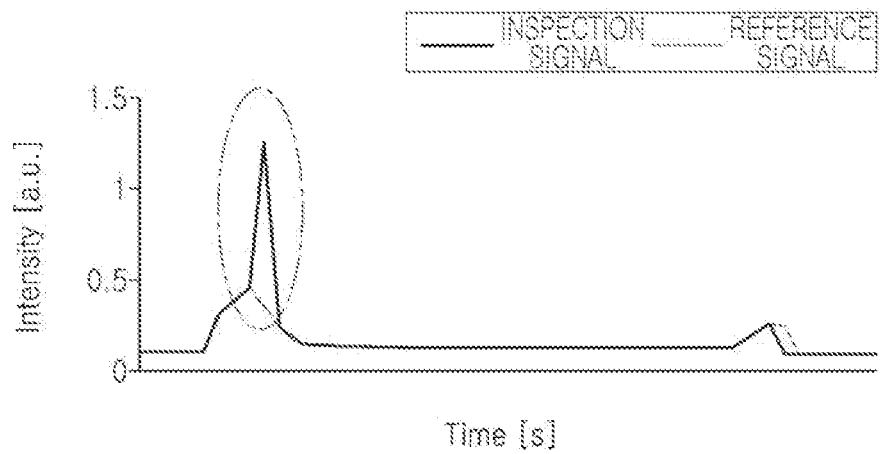
FIGS. 11 and 12 are diagrams illustrating an arcing diagnosis method of an apparatus for arcing diagnosis according to an example embodiments.
Figure 12:
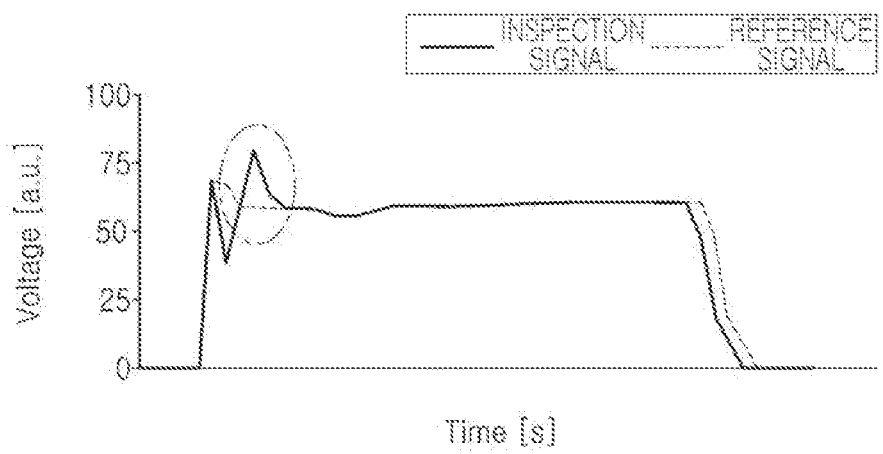

FIG. 10 is a flowchart illustrating an arcing diagnosis method of plasma process equipment according to an example embodiment. FIGS. 11 and 12 are diagrams illustrating an arcing diagnosis method of an apparatus for arcing diagnosis according to an example embodiment.

Referring to FIG. 10, the plasma process equipment in an example embodiment may perform a plasma etching process according to the aforementioned example embodiment described with reference to FIG. 4 (S310). For example, the plasma process equipment may be performed in a process chamber including an upper electrode and a lower electrode, where a substrate on which a plasma etching process is performed is disposed on the lower electrode.

The arcing diagnosis method illustrated in FIG. 10 may determine whether the plasma etching process is completed (S320). When the plasma etching process is not completed (S320, NO), an arcing diagnosis may be performed based on the stored arcing data. For example, the plasma process equipment may determine whether arcing is detected (S330). For example, operation S330 may be similar to operation S230 described above with respect to FIG. 9 and thus repeated description thereof is omitted for conciseness.

The plasma process equipment may determine whether arcing data corresponding to the arcing is stored (S340). For example, the arcing data may include information on the first signal, the second signal, and/or the third signal, and information on whether the substrate is defective when the corresponding signal is output.

Referring to FIG. 11, with respect to the second signal output by the optical sensor, whether arcing occurs may be determined by comparing a reference signal included in the arcing data with an inspection signal obtained in the plasma etching process currently performed.

For example, the reference signal illustrated in FIG. 11 may be the second signal output by the optical sensor. When the inspection signal is compared with the reference signal, light of a high intensity not corresponding to the reference signal may be detected from the inspection signal for a short period of time as illustrated in the circled portion in FIG. 11. Accordingly, the apparatus for arcing diagnosis included in the plasma process equipment may determine that arcing occurs during the corresponding process.

Referring to FIG. 12, with respect to the first signal output by the first VI sensor, by comparing the reference signal included in the arcing data with the inspection signal obtained in the plasma etching process currently performed, whether arcing occurs may be determined.

For example, the reference signal illustrated in FIG. 12 may be the first signal output by the first VI sensor. When the inspection signal is compared with the reference signal, a peak voltage not corresponding to the reference signal illustrated by the circled portion in FIG. 12 may be detected in the inspection signal for a short period of time. Accordingly, the apparatus for arcing diagnosis included in the plasma process equipment may determine that arcing occurs during the corresponding process.

The plasma process equipment in an example embodiment may accurately determine general arcing and also micro-arcing having a level lower than a threshold level using the arcing data obtained from a previously performed plasma etching process.

When the arcing data is not stored (S340, NO), the plasma process equipment may control the environment of the process and may continue the plasma etching process. When the arcing data is stored (S340, YES), the plasma process equipment may properly respond to arcing by using the arcing data. Since the arcing data includes information on whether the substrate is defective, it may be determined whether the process should be ceased based on the arcing data (S350).

When it is determined that it is not necessary to cease the process based on the arcing data) S350, NO), the plasma process equipment may control the environment of process and may continue the plasma etching process. When it is determined that the plasma process should be ceased based on the arcing data (S350, NO), the plasma process equipment may hold the substrate and may cease the process (S360).

A defect inspection may be performed on a substrate having undergone a manufacturing process including the plasma etching process (S370). After the defect inspection is completed, the plasma process equipment in an example embodiment may store information on the first signal, the second signal, and the third signal output during the plasma process for the substrate, and arcing data including the result of the defect inspection (S380). In the subsequent plasma etching process, an arcing diagnosis may be performed based on the stored arcing data.

Figures 13A, 13B:
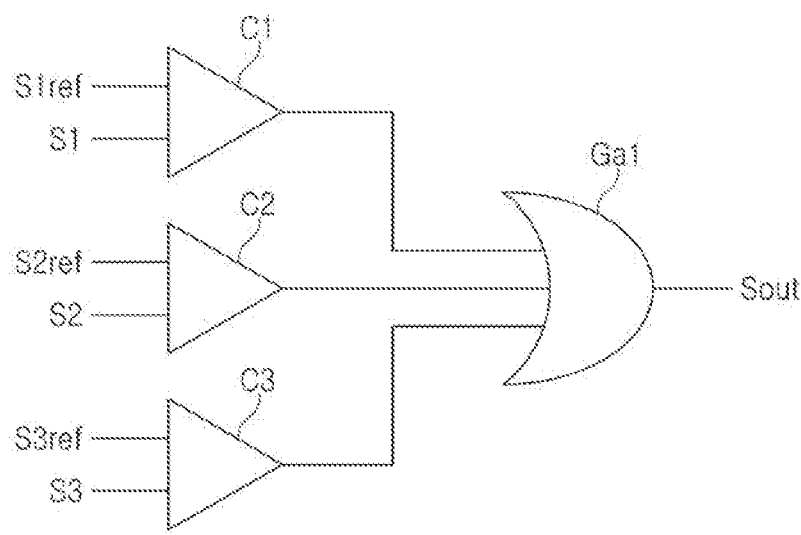
FIGS. 13A and 13B are diagrams illustrating operations of an arcing detector included in an apparatus for arcing diagnosis according to an example embodiment.

FIGS. 13A and 13B are diagrams illustrating operations of an arcing detector included in an apparatus for arcing diagnosis according to an example embodiment.

FIG. 13A may be a diagram illustrating a logic circuit of processes of determining arcing in the apparatus for arcing diagnosis included in the plasma process chamber 110 illustrated in FIG. 4. FIG. 13B may be a diagram illustrating examples of results of arcing diagnosis.

In the apparatus for arcing diagnosis of the plasma process chamber 110 in an example embodiment, the arcing detector 170 may, when arcing is detected in at least one of a first signal S1, a second signal S2, and a third signal S3, determine that arcing occurs in the process chamber 110.

The arcing detector 170 may include a first comparator C1 comparing the first signal S1 with a first reference signal S1ref, a second comparator C2 comparing the second signal S2 with a second reference signal S2ref, a third comparator C3 comparing a third signal S3 with a third reference signal S3ref, and a logic circuit. The logic circuit to which the result of comparison of the signals is applied as an input signal may be an OR gate.

Therefore, as a result of comparing the signals, when a peak signal higher than the reference signal S1ref, S2ref, and S3ref is detected in at least one of the first, second, or third signals S1, S2, or S3, the arcing detector 170 may determine the signal from which the peak signal is detected as an arcing signal corresponding to an abnormal signal when arcing occurs. When the arcing signal is detected, the arcing detector 170 may determine that arcing occurs in the process chamber 110.

Referring to FIG. 13B, the RF VI sensor of the table illustrated in FIG. 3B may be the second VI sensor 140, and the heater VI sensor may be the first VI sensor 160.

In the first case CASE1, an arcing signal of which an output signal is higher than the reference signal may not be detected in the RF VI sensor, the optical sensor, and the heater VI sensor. Accordingly, the arcing detector 170 may determine that arcing does not occur in the process chamber 110 and may output a diagnosis signal Sout corresponding thereto.

In the second case CASE2, an arcing signal of which an output signal is higher than the reference signal may not be detected in the RF VI sensor and the optical sensor, and an arcing signal of which an output signal is higher than the reference signal may be detected in the heater VI sensor. Accordingly, the arcing detector 170 may determine that arcing occurs in the process chamber 110 and may output a diagnostic signal Sout corresponding thereto.

In the third case CASE3, an arcing signal of which an output signal is higher than the reference signal may not be detected in the RF VI sensor, and an arcing signal of which an output signal is higher than the reference signal may be detected in the optical sensor and the heater VI sensor. Accordingly, the arcing detector 170 may determine that arcing occurs in the process chamber 110 and may output a diagnostic signal Sout corresponding thereto.

In the fourth case CASE4, an arcing signal of which an output signal is higher than the reference signal may be detected in the RF VI sensor, the optical sensor, and the heater VI sensor. Accordingly, the arcing detector 170 may determine that arcing occurs in the process chamber 110 and may output a diagnostic signal Sout corresponding thereto.

FIGS. 14A, 14B, and 14C are diagrams illustrating operations of an arcing detector included in an apparatus for arcing diagnosis according to an example embodiment.

FIG. 14A may be a diagram illustrating a logic circuit of processes of determining arcing in the apparatus for arcing diagnosis included in the plasma process chamber 110 illustrated in FIG. 4. FIGS. 14B and 14C may be a diagram illustrating examples of results of arcing diagnosis.

In the apparatus for arcing diagnosis of the plasma process chamber 110 in an example embodiment, the arcing detector 170 may determine a level of arcing occurring in the process chamber 110 based on from which signal arcing is detected from among a first signal S1, a second signal S2, and a third signal S3.

The arcing detector 170 may compare the first signal S1 with a first reference signal S1ref, may compare the second signal S2 with a second reference signal S2ref, and may compare a third signal S3 with a third reference signal S3ref. A first logic gate Gb1 and a second logic gate Gb2 to which at least one of the results of comparison of the signals is applied as an input signal may be an AND gate.

As a result of comparing the signals, when the signals S1, S2, and S3 correspond to (i.e., are less than or equal to) the reference signals S1ref, S2ref, and S3ref, the arcing detector 170 may determine that arcing does not occur in the process chamber 110. For example, when only the first signal S1 is detected as the arcing signal, the arcing detector 170 may determine that the first arcing occurs, when only the first signal S1 and the second signal S2 are detected as arcing signals, the arcing detector 170 may determine that the second arcing occurs, and when the signals S1, S2, and S3 are detected as arcing signals, the arcing detector 170 may determine that the third arcing occurs.

In an example, the first arcing may have a lower level than that of the second arcing, and the second arcing may have a lower level than that of the third arcing. That is, in some example embodiments, the first, second and third reference signals S1ref, S2ref, and S3ref may have different values from one another. However, since an intensity indicated by the second signal S2 output by the optical sensor may be varied depending on the field of view, in some example embodiments, the second arcing may have a level lower than or equal to that of the first arcing.

Referring to FIGS. 14B and 14C, the RF VI sensor in the illustrated table may be the second VI sensor 140, and the heater VI sensor may be the first VI sensor 160. FIG. 14B may be a diagram illustrating examples of output of the first diagnostic signal Sout1 with respect to whether micro-arcing having a low level equal to or less than a threshold level occurs. The threshold level may be predetermined. FIG. 14C may be a diagram illustrating examples of output of the second diagnostic signal Sout2 with respect to whether arcing having a higher level than a level of micro-arcing occurs.

In the first case CASE1 in FIG. 14B, an arcing signal of which an output signal is higher than the reference signal may not be detected in the RF VI sensor, the optical sensor, and the heater VI sensor. Accordingly, the arcing detector 170 may determine that arcing does not occurred in the process chamber 110 and may output a first diagnostic signal Sout1 corresponding thereto.

In the second case CASE2, an arcing signal of which an output signal is higher than the reference signal may not be detected in the RF VI sensor and the optical sensor, and an arcing signal of which an output signal is higher than the reference signal may be detected in the heater VI sensor. Accordingly, the arcing detector 170 may determine that a first arcing corresponding to micro-arcing occurs in the process chamber 110 and may output a first diagnostic signal Sout1 corresponding thereto.

In the third case CASE3, an arcing signal of which an output signal is higher than the reference signal may not be detected in the RF VI sensor, and an arcing signal of which an output signal is higher than the reference signal may be detected in the optical sensor and the heater VI sensor. Accordingly, the arcing detector 170 may determine that micro-arcing does not occur in the process chamber 110 and may output a first diagnostic signal Sout1 corresponding to the second arcing.

In the fourth case CASE4, an arcing signal of which an output signal is higher than the reference signal may be detected in the RF VI sensor, the optical sensor, and the heater VI sensor. Accordingly, the arcing detector 170 may determine that micro-arcing does not occur in the process chamber 110 and may output a first diagnostic signal Sout1 corresponding to the third arcing.

In the first case CASE1 in FIG. 14C, an arcing signal of which an output signal is higher than the reference signal may not be detected in the optical sensor and the heater VI sensor. Accordingly, the arcing detector 170 may determine that arcing does not occur in the process chamber 110 and may output a second diagnostic signal Sout2 corresponding thereto.

In the second case CASE2, an arcing signal of which an output signal is higher than the reference signal may not be detected in the optical sensor, and an arcing signal of which an output signal is higher than the reference signal may be detected in the heater VI sensor. Accordingly, the arcing detector 170 may determine that arcing having a level higher than that of micro-arcing does not occur in the process chamber 110 and may output a second diagnostic signal Sout2 corresponding to the first arcing.

In the third case CASE3 and the fourth case CASE4, an arcing signal of which an output signal is higher than a reference signal may be detected in the optical sensor and the heater VI sensor. Accordingly, the arcing detector 170 may determine that arcing having a level higher than that of micro-arcing occurs in the process chamber 110 and may output a second diagnostic signal Sout2 corresponding thereto.

However, the logic circuits and examples described with reference to FIGS. 14A to 14C are merely examples and example embodiments are not limited thereto. For example, according to an example embodiment, the first arcing, the second arcing, and the third arcing may be defined differently. Accordingly, the logic circuit in FIG. 14A may be configured differently, and the output of the logic circuit may also be different.

According to the aforementioned example embodiments, the apparatus for arcing diagnosis may, by applying the first VI sensor disposed in the power filter connected to the heater or on the power supply line, accurately diagnose micro-arcing.

Also, the apparatus for arcing diagnosis may, by applying the optical sensor and the second VI sensor disposed on the power supply line connected to the upper electrode together with the first VI sensor, improve accuracy of arcing diagnosis.

Further, the plasma process equipment may monitor an abnormal behavior of the process equipment by determining arcing using the apparatus for arcing diagnosis including the first VI sensor.

While various example embodiments have been illustrated and described above, it will be apparent to those skilled in the art that modifications and variations may be made without departing from the scope of the present disclosure as defined by the appended claims.

What is claimed is:

1. An apparatus comprising:
 a first voltage-current sensor disposed in a power filter connected to a heater or on a power supply line connected to the heater, the heater being disposed in a lower electrode of a process chamber in which a plasma process is performed and the first voltage-current sensor configured to sense a harmonic generated from a first power supply that supplies alternating current power to the heater and to output a first signal;
 an optical sensor disposed on one side of the process chamber and configured to sense an intensity of light generated from the process chamber and to output a second signal;
 a second voltage-current sensor disposed on a power supply line connected to an upper electrode of the process chamber, and configured to sense a harmonic generated from a second power supply supplying alternating current power to the upper electrode and to output a third signal; and an arcing detector circuit configured to determine whether arcing occurs in the process chamber based on at least one of the first signal, the second signal, or the third signal.

2. The apparatus of claim 1, wherein the power filter includes an electromagnetic wave filter that attenuates a magnitude of noise transmitted from the heater to the first power supply.

3. The apparatus of claim 1, wherein the arcing detector circuit is configured to determine whether the arcing occurs based on a change in magnitudes of the first signal, the second signal, and the third signal.

4. The apparatus of claim 1, wherein the arcing detector circuit is configured to determine whether the arcing occurs based on a relationship among the first signal, the second signal, and the third signal.

5. The apparatus of claim 1, wherein the arcing detector circuit is configured to detect the first signal, the second signal, and the third signal that are output during a first plasma process and arcing information generated in the first plasma process, and to store arcing data including the arcing information.

6. The apparatus of claim 5, wherein the arcing detector circuit is configured to determine whether arcing occurs in a second plasma process that is performed after the first plasma process by comparing the first signal, the second signal, and the third signal that are output during the second plasma process with the first signal, the second signal, and the third signal that are output during the first plasma process.

7. The apparatus of claim 1, wherein the arcing detector circuit is configured to determine that arcing occurs when arcing is detected in at least one of the first signal, the second signal, and the third signal.

8. The apparatus of claim 7, wherein the arcing detector circuit is configured to determine an arcing level generated in the process chamber based on from which signal among the first signal, the second signal, and the third signal the arcing is detected.

9. The apparatus of claim 8, wherein, when arcing is detected in the first signal and arcing is not detected in the second signal and the third signal, the arcing detector circuit determines that micro-arcing occurs in the process chamber.

10. The apparatus of claim 8, wherein, when arcing is detected in the third signal, the arcing detector circuit determines that arcing having a level higher than a level of micro-arcing occurs in the process chamber.

11. An apparatus comprising:
a first voltage-current sensor that is disposed in a power filter connected between a heater disposed in a lower electrode of a process chamber and a first power supply applying a first voltage to the heater or that is disposed on a first power supply line between the heater and the first power supply, the first voltage-current sensor being configured to detect a harmonic generated from the first power supply and to output a first signal; and
an arcing detector circuit configured to receive the first signal and to determine whether arcing occurs in the process chamber based on the first signal.

12. The apparatus of claim 11, further comprising:
an optical sensor that is disposed on one side of the process chamber and that is configured to sense an intensity of light generated in the process chamber and to output a second signal,
wherein the arcing detector circuit is configured to determine whether the arcing occurs based on the first signal and the second signal.

13. The apparatus of claim 11, further comprising:
a second voltage-current sensor that is disposed on a second power supply line connected to an upper electrode and configured to sense a harmonic generated from a second power supply that supplies alternating current power to the upper electrode and to output a third signal,
wherein the arcing detector circuit is configured to determine whether the arcing occurs based on the first signal and the third signal.

14. The apparatus of claim 13, wherein the arcing detector circuit transmits whether the arcing has occurred to a controller, and
wherein the controller includes a process module controller configured to individually control an environment of a process performed in the process chamber, and a cluster tool controller configured to control equipment including the process chamber.

15. The apparatus of claim 14, wherein, when the arcing determined by the arcing detector circuit is soft arcing, the process module controller controls the environment of the process of the process chamber such that the arcing disappears.

16. The apparatus of claim 14, wherein, when the arcing determined by the arcing detector circuit is hard arcing, the cluster tool controller holds a substrate on the lower electrode and ceases a plasma process performed in the process chamber.

17. An apparatus, comprising:
a first voltage-current sensor configured to sense a first harmonic of a first voltage applied to a heater of a lower electrode included in a process chamber and output a first signal;
an optical sensor configured to sense an intensity of light from the process chamber and output a second signal;
a second voltage-current sensor configured to sense a second harmonic of an alternating current (AC) power applied to an upper electrode included in the process chamber and output a third signal; and
an arcing detector circuit configured to determine that arcing occurs in the process chamber when a peak level of the first signal is greater than a level of a first reference signal.

18. The apparatus of claim 17, wherein the arcing detector circuit includes a first comparator comparing the first signal with the first reference signal, a second comparator comparing the second signal with a second reference signal, a third comparator comparing the third signal with a third reference signal, and a logic circuit receiving outputs of the first to third comparators and outputting a diagnosis signal indicating whether the arcing occurs.

19. The apparatus of claim 18, wherein the logic circuit includes an OR gate.

20. The apparatus of claim 18, wherein the logic circuit includes a first AND gate receiving a complementary signal of a first output of the first comparator, a complementary signal of a second output of the second comparator, and a third output of the third comparator, and outputting a first diagnosis signal, and a second AND gate receiving the first output, the second output and the third output, and outputting a second diagnosis signal.

* * * * *